United States Patent
Ding et al.

(10) Patent No.: US 10,139,958 B2
(45) Date of Patent: Nov. 27, 2018

(54) ORGANIC ELECTROLUMINESCENT TOUCH PANEL INTEGRATING TOUCH CONTROL FUNCTION, DRIVING METHOD FOR THE SAME, AND DISPLAY DEVICE COMPRISING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaoliang Ding, Beijing (CN); Xue Dong, Beijing (CN); Haisheng Wang, Beijing (CN); Xiaochuan Chen, Beijing (CN); Shengji Yang, Beijing (CN); Yingming Liu, Beijing (CN); Wei Liu, Beijing (CN); Lei Wang, Beijing (CN); Tao Ren, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/025,707

(22) PCT Filed: Sep. 21, 2015

(86) PCT No.: PCT/CN2015/090121
§ 371 (c)(1),
(2) Date: Mar. 29, 2016

(87) PCT Pub. No.: WO2016/192247
PCT Pub. Date: Dec. 8, 2016

(65) Prior Publication Data
US 2017/0153759 A1 Jun. 1, 2017

(30) Foreign Application Priority Data

Jun. 1, 2015 (CN) .......................... 2015 1 0293859

(51) Int. Cl.
*G06F 3/041* (2006.01)
*G09G 3/32* (2016.01)
(Continued)

(52) U.S. Cl.
CPC ............ *G06F 3/0418* (2013.01); *G06F 3/044* (2013.01); *G06F 3/0412* (2013.01); *G09G 3/32* (2013.01);
(Continued)

(58) Field of Classification Search
CPC ....................................................... G06F 3/044
See application file for complete search history.

(56) References Cited

U.S. PATENT DOCUMENTS

2009/0040150 A1* 2/2009 Senda .................. G09G 3/3233
345/76
2011/0050674 A1 3/2011 Kim
(Continued)

FOREIGN PATENT DOCUMENTS

CN 101894856 A 11/2010
CN 103208255 A 7/2013
(Continued)

OTHER PUBLICATIONS

First Chinese Office Action dated Dec. 2, 2016.
Search Report and Written Opinion dated Jan. 19, 2016 from State Intellectual Property Office of the P.R. China.

*Primary Examiner* — Chad Dicke
(74) *Attorney, Agent, or Firm* — Dilworth & Barrese, LLP.; Michael J. Musella, Esq.

(57) ABSTRACT

This application provides an organic electroluminescent touch panel, a driving method for the same, and a display
(Continued)

device comprising the same. Without changing the original organic electroluminescent architecture, the cathode layer (2) of the organic electroluminescent architecture is partitioned to form a plurality of cathodes independent of and insulating from each other, the plurality of cathodes serve as touch electrodes to sense occurrence of an outside touch and transmit a touch signal to the touch display integrated chip via the lead wire, implementing that the display panel is integrated with the touch control function based on organic electroluminescent display, and by the pixel driving circuit, the control terminal of the driving module (04) is initialized in the initialization stage, threshold voltage compensation of the driving module (04) is performed in the compensation stage, which avoids an affect caused by change of the threshold voltage of the driving module (04) on lightening luminance, meanwhile, in the touch control stage, signals on the respective signal lines are all modulated in synchronization with external touch control signals sensed by the touch electrodes, the parasitic capacitance of the touch electrode can be eliminated, and touch control performance of the touch panel can be improved.

20 Claims, 6 Drawing Sheets

(51) Int. Cl.
*G06F 3/044* (2006.01)
*H01L 27/32* (2006.01)
*H01L 51/50* (2006.01)
*H01L 51/52* (2006.01)
*G09G 3/3233* (2016.01)

(52) U.S. Cl.
CPC ......... *G09G 3/3233* (2013.01); *H01L 27/323* (2013.01); *H01L 27/3276* (2013.01); *H01L 51/5012* (2013.01); *H01L 51/5056* (2013.01); *H01L 51/5072* (2013.01); *H01L 51/5206* (2013.01); *H01L 51/5225* (2013.01); *G09G 2300/0819* (2013.01); *G09G 2300/0861* (2013.01); *G09G 2310/0251* (2013.01); *G09G 2310/0262* (2013.01); *G09G 2320/043* (2013.01); *G09G 2354/00* (2013.01); *H01L 2251/301* (2013.01); *H01L 2251/308* (2013.01)

(56) References Cited

U.S. PATENT DOCUMENTS

| | | | |
|---|---|---|---|
| 2011/0090200 A1* | 4/2011 | Choi | G09G 3/3233 345/211 |
| 2011/0134100 A1 | 6/2011 | Chung et al. | |
| 2012/0206383 A1* | 8/2012 | Ha | G06F 3/0412 345/173 |
| 2015/0042599 A1* | 2/2015 | Lukanc | G06F 3/0412 345/174 |
| 2016/0098141 A1* | 4/2016 | Kang | G06F 3/0416 345/174 |
| 2016/0349899 A1* | 12/2016 | Hwang | G06F 3/0416 |
| 2016/0363304 A1* | 12/2016 | Omata | G06F 3/044 |

FOREIGN PATENT DOCUMENTS

| | | |
|---|---|---|
| CN | 103456267 A | 12/2013 |
| CN | 103887324 A | 6/2014 |
| CN | 104036725 A | 9/2014 |
| CN | 104064139 A | 9/2014 |
| CN | 104076966 A | 10/2014 |
| CN | 104409467 A | 3/2015 |
| CN | 104575398 A | 4/2015 |
| CN | 104599638 A | 5/2015 |
| CN | 104835454 A | 8/2015 |
| CN | 104464640 A | 3/2016 |

* cited by examiner

ORGANIC ELECTROLUMINESCENT TOUCH PANEL INTEGRATING TOUCH CONTROL FUNCTION, DRIVING METHOD FOR THE SAME, AND DISPLAY DEVICE COMPRISING THE SAME

TECHNICAL FIELD

Embodiments of the present application relate to the field of display technique, and more particularly, to an organic electroluminescent touch panel, a driving method for the same, and a display device comprising the same.

BACKGROUND

As display technique advances, more and more AMOLED (Active Matrix Organic Light Emitting Diode) display panel appears on the market, in comparison to the conventional TFT LCD (Thin Film Transistor Liquid Crystal Display), the AMOLED display panel has advantages of low energy consumption, low production cost, self-luminescence, wide viewing angle and fast response etc. With development of the touch screen technique and as required by the market, overall module thinning is a market development trend, thus the touch architecture develops from touch sensor plug-in to touch sensor built-in, as such, not only thinning of thickness of the touch panel can be implemented, meanwhile costs of the touch screen technique can also be reduced to a large scale, currently, there are three main types of the built-in touch panel: resistive touch panel, capacitive touch panel, and optical touch panel. Therefore, the built-in touch control technique being integrated into the organic electroluminescent display panel can syncretize the advantages of the two, enhance market competitiveness.

However, in a pixel circuit that drives OLED to emit light, because of the manufacturing process and aging of the components, as well as other reasons such as temperature change during operating process, a threshold voltage $V_{th}$ of a driving transistor in the pixel circuit has unevenness, which results in that a current that flows through OLED at each pixel dot changes so that display brightness is uneven, thus display effect of an entire image is affected. Furthermore, in general, a touch electrode of the built-in touch panel adopting the self-capacitance touch control technique has a parasitic capacitance, which mainly comes from signal lines for transmitting various control signals on the touch panel, so, in order to improve touch control performance of the touch panel, it needs to reduce the parasitic capacitance of the touch electrode.

Accordingly, how to integrate the touch control function into the organic electroluminescent display panel and improve touch control display performance of the display panel is an urgent problem that needs to be solved by those skilled in the art.

SUMMARY

Embodiments of the present application provide an organic electroluminescent touch panel, a driving method for the same, and a display device comprising the same, to implement integrating the touch control function into the organic electroluminescent display panel and improve touch control display performance of the display panel.

An embodiment of the invention provides an organic electroluminescent touch panel, comprising: a pixel driving circuit and an organic electroluminescent architecture;

the organic electroluminescent architecture including: an anode layer, a cathode layer, and a light-emitting layer located between the anode layer and the cathode layer; the cathode layer being partitioned into a plurality of cathodes independent of and insulating from each other, the cathodes being connected, via a lead wire, one-by-one, to pins to which a touch display integrated chip corresponds;

the pixel driving circuit including: an initialization module, a charging module, a compensation module, a driving module, and a light-emitting control module; a control terminal of the initialization module being connected to a reset signal terminal, an input terminal thereof being connected to an initialize signal terminal, and an output terminal thereof being connected to a first node; a first control terminal and a second control terminal of the charging module being both connected to a scan signal terminal, a first input terminal thereof being connected to a data signal terminal, a second input terminal thereof being connected to a third node, a first output terminal thereof being connected to the first node, and a second output terminal thereof being connected to a second node; a control terminal of the compensation module being connected to a first signal control terminal, an input terminal thereof being connected to a first reference signal terminal, and an output terminal thereof being connected to the second node; a control terminal of the driving module being connected with the first node, an input terminal thereof being connected to the first reference signal terminal, and an output terminal thereof being connected to the third node; a control terminal of the light-emitting control module being connected to a second signal control terminal, an input terminal thereof being connected to the third node, and an output terminal thereof being connected to the anode layer of the organic electroluminescent architecture, wherein in an initialization stage, the initialization module is configured to, under control of the reset signal terminal, initialize the first node via an initialize signal inputted by the initialize signal terminal; in a charging stage, the charging module is configured to, under control of the scan signal terminal, perform data writing at the first node and the second node via a data signal inputted by the data signal terminal; in a compensation stage, the compensation module is configured to, under control of the first signal control terminal, perform threshold voltage compensation of the driving module at the first node via a signal inputted by the first reference signal terminal; in a light-emitting stage, the light-emitting control module is turned on under control of the second signal control terminal, the driving module is configured to, under control of the first node, drive the organic electroluminescent architecture to emit light via the light-emitting control module that is turned on; in a touch control stage, the plurality of cathodes formed by partitioning the cathode layer of the organic electroluminescent architecture serve as touch electrodes to sense occurrence of an outside touch and transmit a touch signal to the touch display integrated chip via the lead wire.

In a possible implementation, in the organic electroluminescent touch panel provided above by the embodiment of the present application, the cathode layer of the organic electroluminescent architecture are partitioned to form a plurality of square cathodes, each square cathode has a side length of 4 mm In a possible implementation, in the organic electroluminescent touch panel provided above by the embodiment of the present application, the lead wire is located in a metal layer where a gate line resides, or in a source-drain metal layer, or in a third metal layer other than the metal layer where a gate line resides and the source-drain metal layer.

In a possible implementation, in the organic electroluminescent touch panel provided above by the embodiment of the present application, the organic electroluminescent architecture further comprises a hole transmission layer and an electron transmission layer;

the hole transmission layer is located between the anode layer and the light-emitting layer;

the electron transmission layer is located between the cathode layer and the light-emitting layer.

In a possible implementation, in the organic electroluminescent touch panel provided above by the embodiment of the present application, material of the cathode layer is a magnesium aluminum alloy or a magnesium silver alloy, material of the anode material layer is ITO material.

In a possible implementation, in the organic electroluminescent touch panel provided above by the embodiment of the present application, the driving module includes a driving transistor;

a gate of the driving transistor is connected to the first node, a source thereof is connected to the first reference signal terminal, and a drain thereof is connected to the third node.

In a possible implementation, in the organic electroluminescent touch panel provided above by the embodiment of the present application, the initialization module includes a first switching transistor;

a gate of the first switching transistor is connected to the reset signal terminal, a source thereof is connected to the initialize signal terminal, and a drain thereof is connected to the first node.

In a possible implementation, in the organic electroluminescent touch panel provided above by the embodiment of the present application, the charging module includes a second switching transistor, a third switching transistor, and a capacitor;

a gate of the second switching transistor is connected to the scan signal terminal, a source thereof is connected to the third node, and a drain thereof is connected to the first node;

a gate of the third switching transistor is connected to the scan signal terminal, a source thereof is connected to the data signal terminal, and a drain thereof is connected to the second node; and the capacitor is connected between the first node and the second node.

In a possible implementation, in the organic electroluminescent touch panel provided above by the embodiment of the present application, the compensation module includes a fourth switching transistor;

a gate of the fourth switching transistor is connected to the first signal control terminal, a source thereof is connected to the first reference signal terminal, a drain thereof is connected to the second node.

In a possible implementation, in the organic electroluminescent touch panel provided above by the embodiment of the present application, the light-emitting control module includes a fifth switching transistor;

a gate of the fifth switching transistor is connected to the second signal control terminal, a source thereof is connected to the third node, and a drain thereof is connected to the anode layer of the organic electroluminescent architecture.

An embodiment of the present application provides a driving method for the organic electroluminescent touch panel described above, comprising: an initialization stage, a charging stage, a compensation stage, a light-emitting stage, and a touch control stage that proceed sequentially; wherein in the initialization stage, the initialization module is configured to, under control of the reset signal terminal, initialize the first node via an initialize signal inputted by the initialize signal terminal;

in the charging stage, the charging module is configured to, under control of the scan signal terminal, perform data writing at the first node and the second node via a data signal inputted by the data signal terminal;

in the compensation stage, the compensation module is configured to, under control of the first signal control terminal, perform threshold voltage compensation of the driving module at the first node via a signal inputted by the first reference signal terminal;

in the light-emitting stage, the light-emitting control module is turned on under control of the second signal control terminal, the driving module is configured to, under control of the first node, drive the organic electroluminescent architecture to emit light via the light-emitting control module that is turned on; and in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire.

An embodiment of the present application provides a display device comprising the organic electroluminescent touch panel described above.

Beneficial effects of the embodiments of the present application comprise:

The embodiments of the present application provide an organic electroluminescent touch panel, a driving method for the same, and a display device comprising the same, the organic electroluminescent touch panel comprising: a pixel driving circuit and an organic electroluminescent architecture; wherein a cathode layer of the organic electroluminescent architecture is partitioned into a plurality of cathodes independent of and insulating from each other, the cathodes being connected, via a lead wire, one-by-one, to pins to which a touch display integrated chip corresponds; as such, in a charging stage, the charging module performs data writing at the first node and the second node; in a compensation stage, the compensation module performs threshold voltage compensation of the driving module at the first node; in a light-emitting stage, the driving module drives the organic electroluminescent architecture to emit light via the light-emitting control module that is turned on; in a touch control stage, the plurality of cathodes formed by partitioning the cathode layer of the organic electroluminescent architecture serve as touch electrodes to sense occurrence of an outside touch and transmit a touch signal to the touch display integrated chip via the lead wire. Without changing the original organic electroluminescent architecture, by means of partitioning the cathode layer of the organic electroluminescent architecture, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, and further, determination of touch control points is implemented, that is, implementing that the display panel is integrated with the touch control function based on organic electroluminescent display, and the pixel driving circuit initializes the control terminal of the driving module in the initialization stage, threshold voltage compensation of the driving module is performed in the compensation stage, which avoids an affect caused by change of the threshold voltage of the driving module on lightening luminance, and improves evenness of lightening luminance of the display panel, thus ensures display image quality, meanwhile, in the touch control stage, the plurality of cathodes formed by partitioning the cathode layer of the organic electroluminescent architecture serve as touch electrodes to sense occurrence of an outside touch, signals on the rest signal lines for transmitting various signals, such as a scan signal line, a data line, a power source voltage line, are all modulated in synchronization with external touch control signals sensed by the touch electrodes, the parasitic capacitance of the touch electrode can be eliminated, and touch control performance of the touch panel can be improved.

DETAILED DESCRIPTION OF THE EMBODIMENTS

Hereinafter, in conjunction with the accompanying drawings, concrete implementations of the organic electroluminescent touch panel, the driving method for the same, and the display device comprising the same provided by the embodiments of the present application will be described in detail.

An embodiment of the present application provides an organic electroluminescent touch panel, which may comprise: a pixel driving circuit and an organic electroluminescent architecture.

Figure 1A:
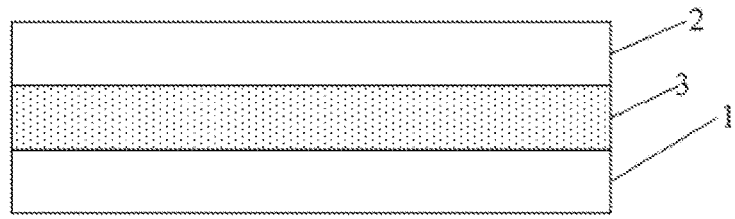
FIG. 1a is a first schematic diagram of the organic electroluminescent architecture provided by an embodiment of the present application.
Figure 1B:
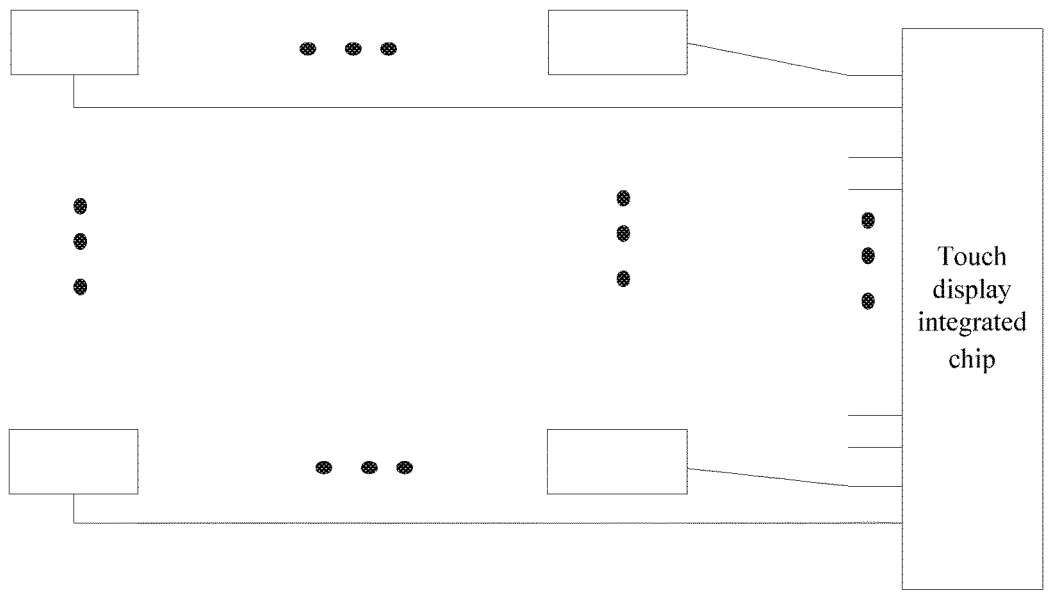
FIG. 1b is a schematic diagram of partitions of the cathode layer of the organic electroluminescent architecture provided by an embodiment of the present application.
Figure 1C:
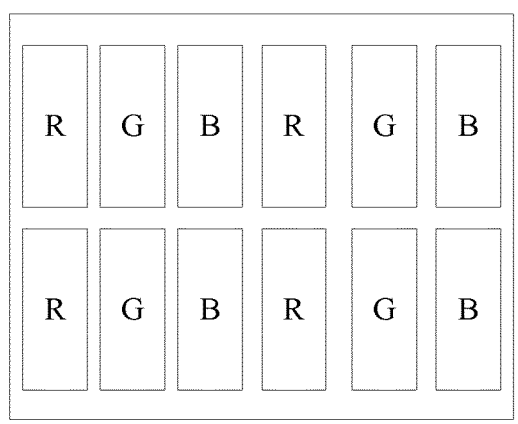
FIG. 1c is a schematic diagram of pixel cells to which the cathode provided by an embodiment of the present application corresponds.

As shown in FIG. 1a, the organic electroluminescent architecture may include: an anode layer 1, a cathode layer 2, and a light-emitting layer 3 located between the anode layer 1 and the cathode layer 2; wherein the cathode layer 2 is partitioned into a plurality of cathodes independent of and insulating from each other (partitions of the cathode layer are as shown in FIG. 1b, wherein no limitations are made to shape of regions into which the cathode layer are partitioned, shape of partitions of the cathode layer may be determined according to practical manufacturing process, each partitioned cathode corresponds to a corresponding pixel cell, corresponding pixel cells are as shown in FIG. 1c), the cathodes are connected, via a lead wire, one-by-one, to pins to which a touch display integrated chip corresponds; the cathode serves as the cathode of the organic electroluminescent architecture in the display stage, and as the touch electrode in the touch control stage, the organic electroluminescent control panel is driven in a time-sharing way.

Figure 2:
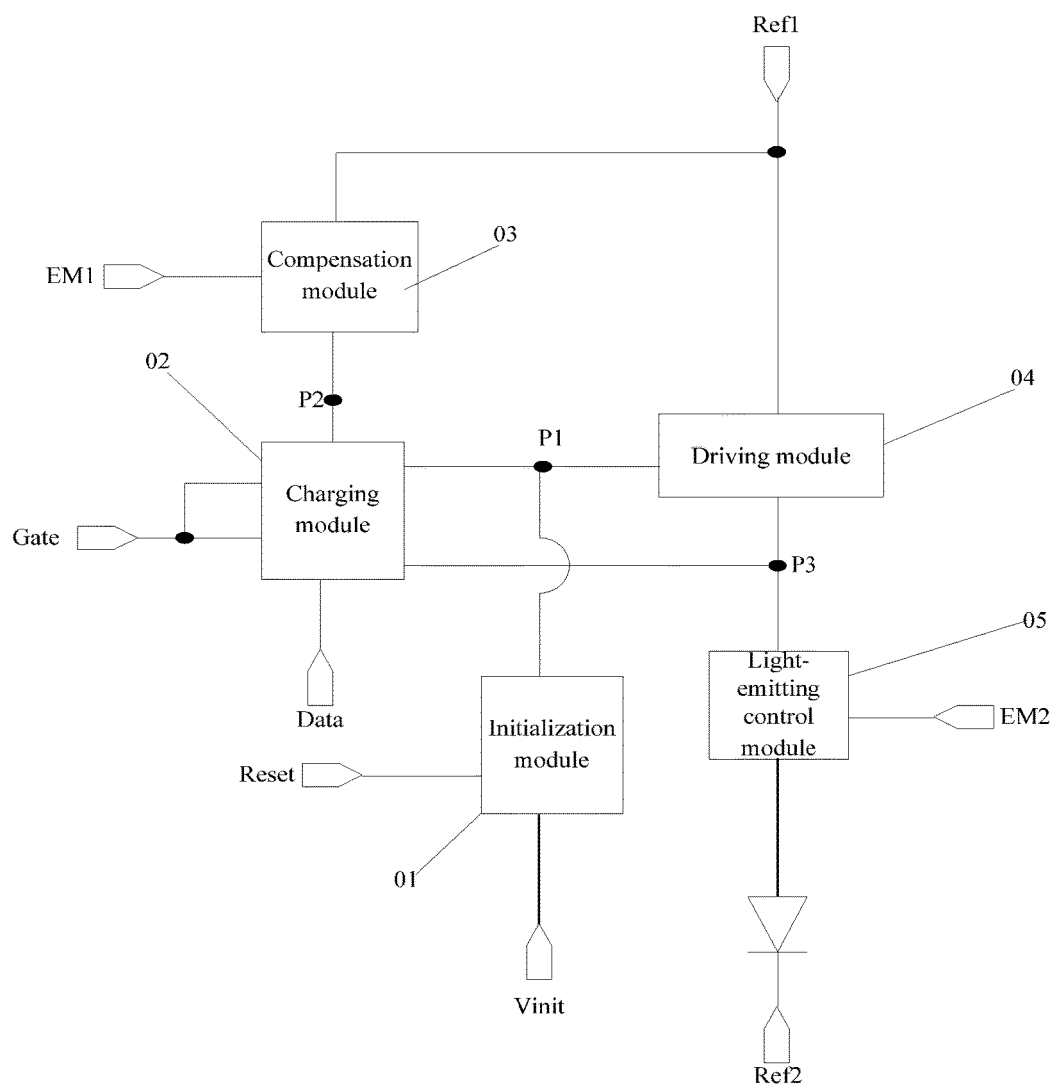
FIG. 2 is a schematic diagram of structure of the pixel driving circuit provided by an embodiment of the present application.

As shown in FIG. 2, the pixel driving circuit may include: an initialization module 01, a charging module 02, a compensation module 03, a driving module 04, and a light-emitting control module 05; a control terminal of the initialization module 01 being connected to a reset signal terminal Reset, an input terminal thereof being connected to an initialize signal terminal Vinit, and an output terminal thereof being connected to a first node P1; a first control terminal and a second control terminal of the charging module 02 being both connected to a scan signal terminal Gate, a first input terminal thereof being connected to a data signal terminal Data, a second input terminal thereof being connected to a third node P3, a first output terminal thereof being connected to the first node P1, and a second output terminal thereof being connected to a second node P2; a control terminal of the compensation module 03 being connected to a first signal control terminal EM1, an input terminal thereof being connected to a first reference signal terminal Ref1, and an output terminal thereof being connected to the second node P2; a control terminal of the driving module 04 being connected with the first node P1, an input terminal thereof being connected to the first reference signal terminal Ref1, and an output terminal thereof being connected to the third node P3; a control terminal of the light-emitting control module 05 being connected to a second signal control terminal EM2, an input terminal thereof being connected to the third node P3, and an output terminal thereof being connected to the anode layer of the organic electroluminescent architecture.

In an initialization stage, the initialization module 01 is configured to, under control of the reset signal terminal Reset, initialize the first node P1 via an initialize signal inputted by the initialize signal terminal Vinit; in a charging stage, the charging module 02 is configured to, under control of the scan signal terminal Gate, perform data writing at the first node P1 and the second node P2 via a data signal inputted by the data signal terminal Data; in a compensation stage, the compensation module 03 is configured to, under control of the first signal control terminal EM1, perform threshold voltage compensation of the driving module 04 at the first node P1 via a signal inputted by the first reference signal terminal Ref1; in a light-emitting stage, the light-emitting control module 05 is turned on under control of the second signal control terminal EM2, the driving module 04 is configured to, under control of the first node P1, drive the organic electroluminescent architecture to emit light via the light-emitting control module 05 that is turned on; and in a touch control stage, the plurality of cathodes formed by partitioning the cathode layer of the organic electroluminescent architecture serve as touch electrodes to sense occurrence of an outside touch and transmit a touch signal to the touch display integrated chip via the lead wire.

In the organic electroluminescent touch panel provided above by an embodiment of the present application comprises a pixel driving circuit and an organic electroluminescent architecture. A cathode layer of the organic electroluminescent architecture is partitioned into a plurality of cathodes independent of and insulating from each other, the cathodes being connected, via a lead wire, one-by-one, to pins to which a touch display integrated chip corresponds; as such, in a charging stage, the charging module 02 performs data writing at the first node P1 and the second node P2; in a compensation stage, the compensation module 03 performs threshold voltage compensation of the driving module 04 at the first node P1; in a light-emitting stage, the driving module 04 drives the organic electroluminescent architecture to emit light via the light-emitting control module 05 that is turned on; in a touch control stage, the plurality of cathodes formed by partitioning the cathode layer of the organic electroluminescent architecture serve as touch electrodes to sense occurrence of an outside touch and transmit a touch signal to the touch display integrated chip via the lead wire. Without changing the original organic electroluminescent architecture, by means of partitioning the cathode layer of the organic electroluminescent architecture, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, and further, determination of touch control points is implemented, that is, implementing that the display panel is integrated with the touch control function based on organic electroluminescent display, and the pixel driving circuit initializes the control terminal of the driving module in the initialization stage, threshold voltage compensation of the driving module is performed in the compensation stage, which avoids an affect caused by change of the threshold voltage of the driving module on lightening luminance, and improves evenness of lightening luminance of the display panel, thus ensures display image quality, meanwhile, in the touch control stage, the plurality of cathodes formed by partitioning the cathode layer of the organic electroluminescent architecture serve as touch electrodes to sense occurrence of an outside touch, signals on the rest signal lines for transmitting various signals, such as a scan signal line, a data line, a power source voltage line, are all modulated in synchronization with external touch control signals sensed by the touch electrodes, the parasitic capacitance of the touch electrode can be eliminated, and touch control performance of the touch panel can be improved.

In a specific implementation, in the organic electroluminescent touch panel provided by an embodiment of the present application, in order to implement integrating the touch control technique into the organic electroluminescent touch panel, as shown in FIG. 1b, the cathode layer of the organic electroluminescent architecture is partitioned into a plurality of cathodes m independent of and insulating from each other, the cathodes are connected, via a lead wire, one-by-one, to pins to which a touch display integrated chip corresponds, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, to thereby achieve the touch control function. No limitations are made to shape of the cathodes formed by partitioning the cathode layer, shape and size of partitions of the cathode layer can be determined according to practical manufacturing process and parameters such as size of the touch panel and accuracy of the touch control, for example, the cathode layer of the organic electroluminescent architecture may be partitioned to form a plurality of square cathodes, each square cathode has a side length of 4 mm.

In a specific implementation, in the organic electroluminescent touch panel provided by an embodiment of the present application, in order to simplify manufacturing process of the touch panel, the lead wire, which connects the cathode layer of the organic electroluminescent architecture and the pins to which a touch display integrated chip corresponds, may be disposed in the same layer of the original mental layer, that is, the lead wire may be located in a metal layer where a gate line resides, or in a source-drain metal layer, or in a third metal layer other than the metal layer where a gate line resides and the source-drain metal layer, thus disposing of the lead wire may be determined according to practical manufacturing process, and no definitions are made here, as such, in the touch control stage, the cathode layer of the organic electroluminescent architecture serves as touch electrodes to sense occurrence of an outside touch and transmit a touch signal to the touch display integrated chip via the lead wire, thereby finally determining the touch control points and achieving the touch control function.

Figure 3:
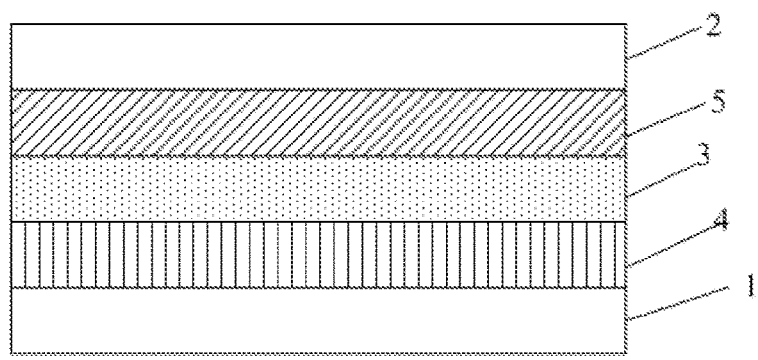
FIG. 3 is a second schematic diagram of the organic electroluminescent architecture provided by an embodiment of the present application.

In a specific implementation, in the organic electroluminescent touch panel provided by an embodiment of the present application, as shown in FIG. 3, the organic electroluminescent architecture further comprises a hole transmission layer 4 and an electron transmission layer 5; the hole transmission layer 4 is located between the anode layer 1 and the light-emitting layer 3; the electron transmission layer 5 is located between the cathode layer 2 and the light-emitting layer 3, as such, in the display stage, by applying a voltage to the anode layer 1 and cathode layer 2 of the organic electroluminescent architecture, holes and electrons are separately injected from the cathode layer 2 and the anode layer 1, pass through the hole transmission layer 4 and the electron transmission layer 5 and meet in the light-emitting layer 3 to form excitons, exciton recombination luminescence achieves normal light emitting of the organic electroluminescent architecture, which has the following advantages in comparison to the liquid crystal display: light and thin, wide viewing angle, fast response, high light emitting efficiency.

In a specific implementation, in the organic electroluminescent touch panel provided by an embodiment of the present application, material of the cathode layer of the organic electroluminescent architecture is a magnesium aluminum alloy or a magnesium silver alloy, material of the anode material layer thereof is ITO material. Of course, the cathode layer and the anode layer of the organic electroluminescent architecture may be other materials capable of achieving their corresponding functions, no limitations are made here, wherein corresponding voltage signals are applied to the cathode layer and the anode layer of the organic electroluminescent architecture in the display stage to implement normal light emitting of the organic electroluminescent architecture, in the touch control stage, the cathode layer of the organic electroluminescent architecture serves as touch electrodes to sense occurrence of an outside touch and transmit a touch signal to the touch display integrated chip via the lead wire, thereby finally determining the touch control points and achieving the touch control function. Therefore, the organic electroluminescent display panel provided above by an embodiment of the present application integrates the original electroluminescent display and the touch control function, and syncretize the advantages of the two.

Figure 4:
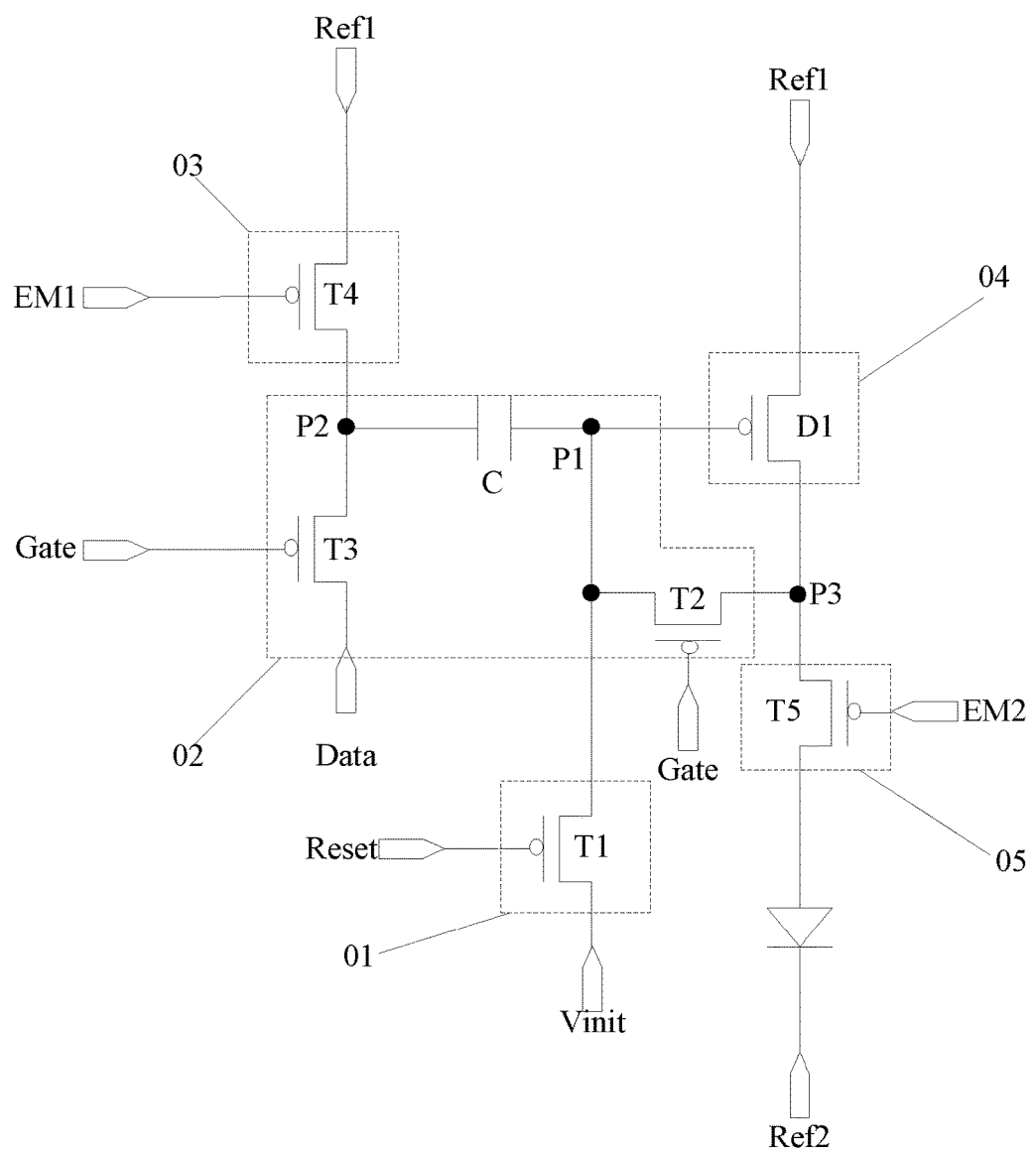
FIG. 4 is a schematic diagram of specific configuration of the pixel driving circuit provided by an embodiment of the present application.

In a specific implementation, in the organic electroluminescent touch panel provided by an embodiment of the present application, as shown in FIG. 4, the driving module 04 may include a driving transistor D1; a gate of the driving transistor D1 is connected to the first node P1, a source thereof is connected to the first reference signal terminal Ref1, and a drain thereof is connected to the third node P3. Specifically, in the initialization stage, the initialization module 01 makes, under control of the reset signal terminal Reset, the gate of the driving transistor D1, i.e. the first node P1, and the initialization signal terminal Vini conductive, initializes the control terminal of the driving module 04, i.e., the gate of the driving transistor D1, which can eliminate the influence of a previous pressure difference on a subsequent stage, meanwhile provide time for a recovery process of the threshold voltage of the process driving transistor D1, in the charging stage and the compensation stage, data writing and threshold voltage compensation are performed at the first node P1, i.e., the gate of the driving transistor D1, via the charging module 01 and the compensation module 03, so that the driving transistor D1 drives the organic electroluminescent architecture to normally emit light in the light-emitting stage, and a driving current that drives the organic electroluminescent architecture to emit light is independent of the threshold voltage of the driving transistor D1, which avoids the affect caused by change of the threshold voltage of the driving module on lightening luminance In a specific implementation, in the organic electroluminescent touch panel provided by an embodiment of the present application, as shown in FIG. 4, the initialization module 01 includes a first switching transistor T1; a gate of the first switching transistor T1 is connected to the reset signal terminal Reset, a source thereof is connected to the initialize signal terminal Vinit, and a drain thereof is connected to the first node P1. Specifically, in the initialization stage, the first switching transistor T1 is turned on under control of the reset signal terminal Reset, the turned-on first switching transistor T1 makes the initialize signal terminal Vinit and the first node P1 conductive, the initialize signal terminal Vinit inputs an initialized voltage signal (the initialized voltage signal may be 0 or other initialized voltage signal, the initialized voltage signal may be selected according to a type of the transistor in the driving circuit), the initialized voltage signal passes through the turned-on first switching transistor T1, a voltage signal at the first node P1 is initialized as the initialized voltage signal, thereby implementing initialization to the first node P, that is, the initialization to the control terminal of the driving module 04.

In a specific implementation, in the organic electroluminescent touch panel provided by an embodiment of the present application, as shown in FIG. 4, the charging module 02 may include a second switching transistor T2, a third switching transistor T3, and a capacitor C; wherein a gate of the second switching transistor T2 is connected to the scan signal terminal Gate, a source thereof is connected to the third node P3, and a drain thereof is connected to the first node P1; a gate of the third switching transistor T3 is connected to the scan signal terminal Gate, a source thereof is connected to the data signal terminal Data, and a drain thereof is connected to the second node P2; and the capacitor C is connected between the first node P1 and the second node P2.

Specifically, in the charging stage, the second switching transistor T2 and the third switching transistor T3 are turned on under control of the scan signal terminal Gate, the turned-on third switching transistor T3 makes the data signal terminal Data and the second node P2, i.e., the left terminal of the capacitor C conductive, and then passes a signal Vdata inputted by the data signal terminal Data to the left terminal of the capacitor C, that is, in this case, a voltage V1 at the left terminal of the capacitor C is V1=Vdata, and a voltage at the right terminal (i.e., the first node P1) of the capacitor C also becomes Vdata as driven by the charging of the capacitor C, in this case, the driving transistor D1 is in a turned-on state, the signal Vdd at the first reference signal terminal Ref1 is outputted to the right terminal of the capacitor C via the turned-on driving transistor D1 and second switching transistor T2, i.e., in this case, a voltage at the first node P1 is Vdd−Vth, where Vth is a threshold voltage of the driving transistor D1, and at this time, a voltage difference across two terminals of the capacitor C is Vdata−Vdd+Vth.

In a specific implementation, in the organic electroluminescent touch panel provided by an embodiment of the present application, as shown in FIG. 4, the compensation module 03 may include a fourth switching transistor T4; a gate of the fourth switching transistor T4 is connected to the first signal control terminal EM1, a source thereof is connected to the first reference signal terminal Ref1, a drain thereof is connected to the second node P2. Specifically, in the compensation stage, the fourth switching transistor T4 is turned on under control of the first signal control terminal EM1, the turned-on fourth switching transistor T4 makes the first reference signal Ref1 and the second node P2 conductive, thus, a voltage signal Vdd inputted by the first reference signal terminal is transmitted to the second node P2, and then a voltage signal at the second node P2, i.e., the left terminal of the capacitor C, becomes Vdd, since the charging stage makes a voltage difference across two terminals of the capacitor C be Vdata−Vdd+Vth, therefore, at this time, a voltage at the right terminal of the capacitor C is 2Vdd−Vdata−Vth.

In a specific implementation, in the organic electroluminescent touch panel provided by an embodiment of the present application, as shown in FIG. 4, the light-emitting control module 05 may include a fifth switching transistor T5; a gate of the fifth switching transistor T5 is connected to the second signal control terminal EM2, a source thereof is connected to the third node P3, and a drain thereof is connected to the anode layer of the organic electroluminescent architecture. Specifically, in the light-emitting stage, the fifth switching transistor T5 is turned on under control of the second signal control terminal EM2, the turned-on fifth switching transistor T5 makes the third node P3, i.e., the drain of the driving transistor D1, and the anode layer of the organic electroluminescent architecture conductive, in this case, a signal Vss at the second reference voltage signal terminal Ref2 is inputted to the cathode layer of the organic electroluminescent architecture, the driving transistor D1 is turned on under the control of the first node P1, to drive the organic electroluminescent architecture to normally emit light by turning on the fifth switching transistor T5; in the touch control stage, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, thus achieving the touch control function.

It needs to be noted that the switching transistors and the driving transistor mentioned above in the embodiments of the present application may be TFT (Thin Film Transistor), may also be MOS (Metal Oxide Semiconductor), no limitations are made here. In a specific implementation, source and drain of these transistors can be interchanged, no differentiation is made in particular. When describing a specific embodiment, description is provided with the TFT as an example.

Figure 5:
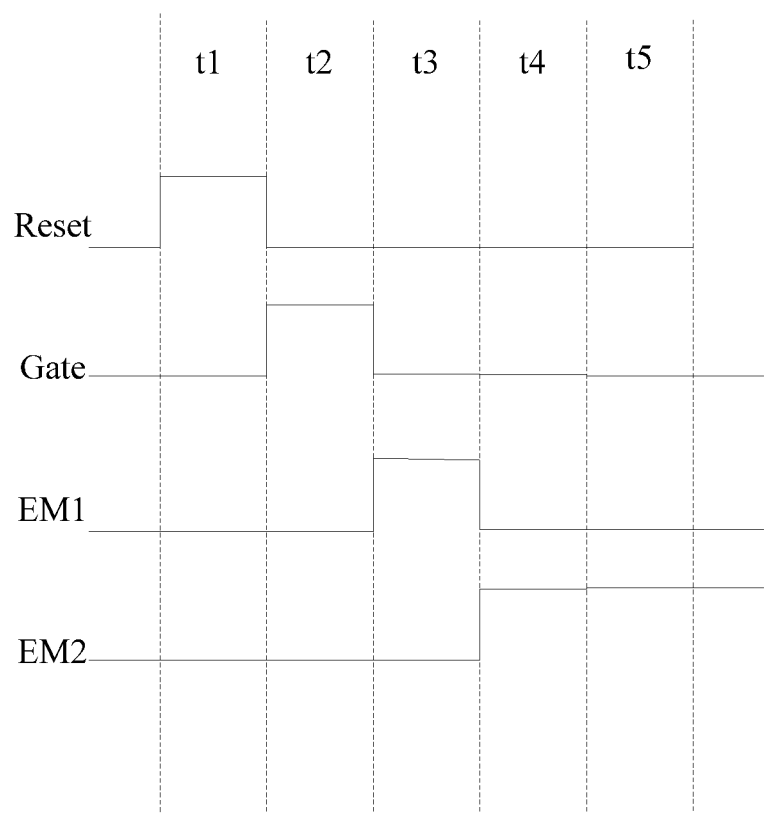
FIG. 5 is an operation timing diagram of the pixel driving circuit provided by an embodiment of the present application.

Next, an operation process of the pixel circuit provided by the embodiments of the present application will be described in detail in conjunction with the pixel driving circuit and the operation timing provided by the embodiments of the present application. The operation process of the pixel driving circuit provided by the embodiments of the present application is described by adopting the pixel circuit designed with the P-type transistor shown in FIG. 4 and the input output timing diagram shown in FIG. 5. Specifically, five stages t1 to t5 in the input output timing diagram as shown in FIG. 5 are selected. In the following description, 1 represents a high level signal, 0 indicates a low level signal.

At stage t1, Reset=0, EM1=1, EM2=1, Gate=1, Ref1=Vdd, Ref2=Vss. Since Reset=0, thus the first switching transistor T1 is turned on; since EM1=1, EM2=1, Gate=1, thus the second switching transistor T2, the third switching transistor T3, the fourth switching transistor T4, and the fifth switching transistor T5 are turned off. The turned-on first switching transistor T1 makes the gate of the driving transistor D1 (i.e., the first node P1) and the initialize signal terminal Vinit conductive, thereby initializes the voltage at the gate of the driving transistor D1, charges at the two terminals of the capacitor C are cleared, to eliminate the influence of a previous pressure difference on a subsequent stage. The stage t1 is the initialization stage.

At stage t2, Reset=1, EM1=1, EM2=t1, Gate=0, Ref1=Vdd, Ref2=Vss. Since Gate=0, thus the second switching transistor T2 and the third switching transistor T3 are turned on; the since Reset=1, EM1=1, EM2=1, thus the first switching transistor T1, the fourth switching transistor T4, and the fifth switching transistor T5 are turned off. The turned-on third switching transistor T3 makes the data signal terminal Data and the second node P2, i.e., the left terminal of capacitor C, conductive, and then passes the data signal Vdata inputted by the data signal input terminal Data to the left terminal of the capacitor C, in this case, a voltage V1 at the left terminal of the capacitor C is V1=Vdata, and a voltage at the right terminal of the capacitor C (i.e., the first node P1) also becomes Vdata as driven by the charging of the capacitor C, in this case, the driving transistor D1 in the turned-on state, the signal Vdd at the first reference signal terminal Ref1 is outputted to the right terminal of the capacitor C via the turned-on driving transistor D1 and second switching transistor T2, i.e., in this case, the voltage at the first node P1 is Vdd−Vth, where Vth is the threshold voltage of the driving transistor D1, and at this time a voltage difference across two terminals of the capacitor C is Vdata−Vdd+Vth. Stage t2 is the charging stage.

At stage t3, Reset=1, EM1=1, EM2=0, Gate=1, Ref1=Vdd, Ref2=Vss. Since EM1=0, thus the fourth switching transistor T4 is turned on; since the Reset=1, EM2=1, Gate=1, thus the first switching transistor T1, the second switching transistor T2, the third switching transistor T3, and the fifth switching transistor T5 are turned off. The turned-on fourth switching transistor T4 makes the first reference signal Ref1 and the second node P2 conductive, thus the voltage signal Vdd inputted by first reference signal terminal Ref1 is transmitted to the second node P2, further, the voltage signal at the second node P2, i.e., the left terminal of the capacitor C, becomes Vdd, since the charging stage makes a voltage difference across two terminals of the capacitor C be Vdata−Vdd+Vth, therefore, at this time, a voltage at the right terminal of the capacitor C is 2Vdd−Vdata−Vth. Stage t3 is the compensation stage.

At stage t4, Reset=1, EM1=1, EM2=0, Gate=1, Ref1=Vdd, Ref2=Vss. Since EM2=0, thus the fifth switching transistor T5 is turned on; since the Reset=1, EM1=1, Gate=1, thus the first switching transistor T1, the second switching transistor T2, the third switching transistor T3, and the fourth switching transistor T4 are turned off. The turned-on fifth switching transistor T5 makes the third node P3, i.e. the drain of the driving transistor D1, and the anode layer of the organic electroluminescent light-emitting architecture conductive, in this case, a signal Vss at the second reference voltage signal terminal Ref2 is inputted to the cathode layer of the organic electroluminescent architecture, the driving transistor D1 is turned on under control of the first node P1, to drive the organic electroluminescent architecture to normally emit light by turning on the fifth switching transistor T5, at this time, the current that drives the organic electroluminescent architecture to emit light is:

$$I=\tfrac{1}{2}K(Vgs-Vth)^2=\tfrac{1}{2}K[Vdd-(2Vdd-Vdata-Vth)-Vth]^2=\tfrac{1}{2}K(Vdata-Vdd)^2$$

where K is a constant related to a manufacturing parameter and a geometry size of the driving transistor D1, Vgs is a voltage difference between the gate and the source of the driving transistor D1. From the above analysis it is known that the current that drives the organic electroluminescent architecture to emit light is authentically independent of the threshold voltage of the driving transistor D1, which eliminates the affect caused by change of the threshold voltage of the driving transistor D1 on lightening luminance, and improves evenness of lightening luminance of the display panel. Stage t4 is the light emitting stage.

Figure 6:
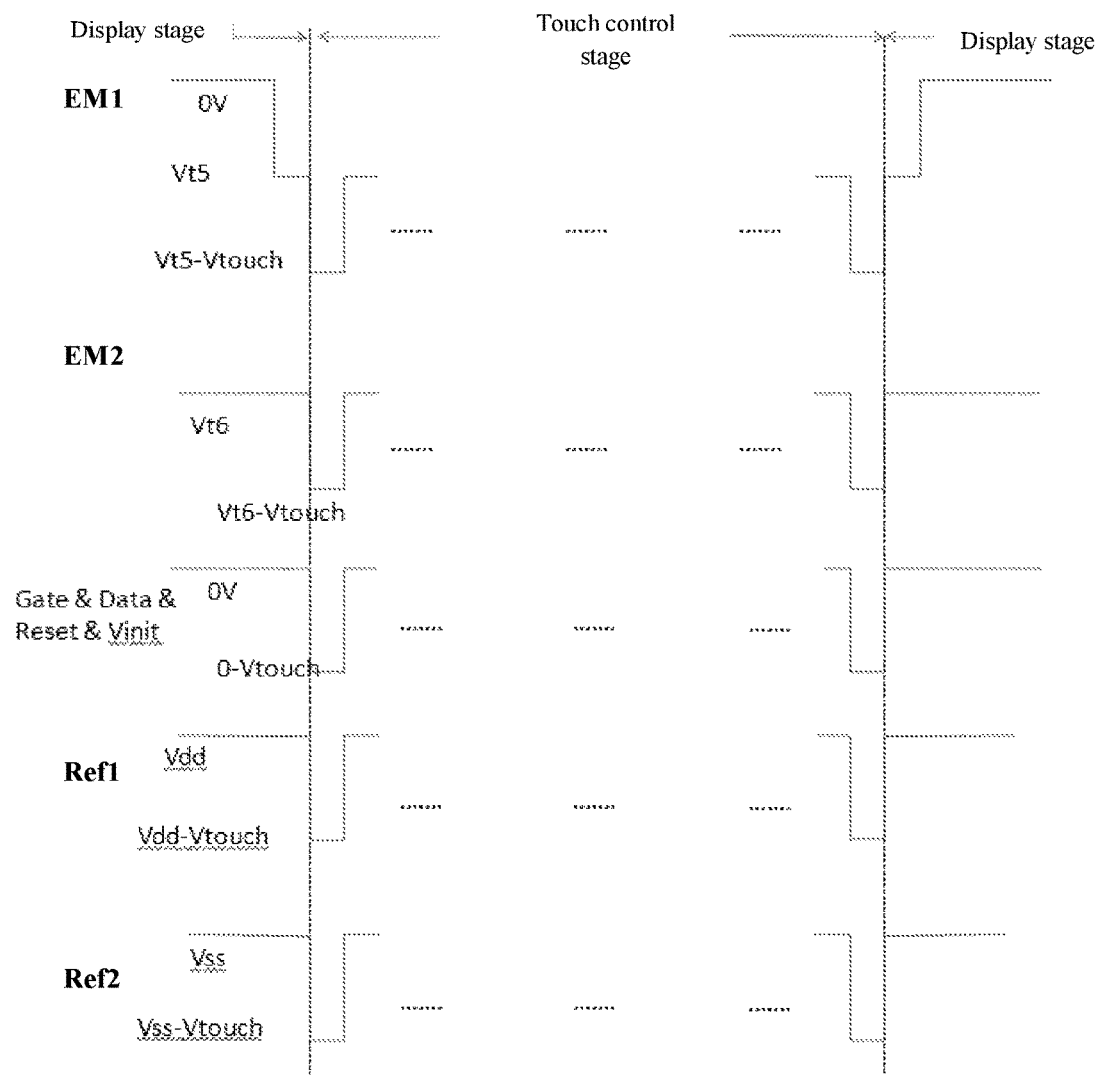
FIG. 6 is a schematic diagram of synchronous modulation of respective signal lines in the touch control stage provided by an embodiment of the present application.

At stage t5, the cathode layer of the organic electroluminescent architecture serves as touch electrodes to sense occurrence of an outside touch and transmit a touch signal to the touch display integrated chip via the lead wire, thereby achieving the touch control function, thus stage t5 is the touch control stage, at this stage, the plurality of cathodes formed by partitioning the cathode layer of the organic electroluminescent architecture serve as touch g electrodes to sense occurrence of an outside touch, thus the signal at the second reference signal terminal connected to the cathodes will change due to the generation of the touch control signal, correspondingly, the signal at the driving signal line that drives the touch electrodes, i.e., the signal line that provides a signal to the second reference signal terminal, will change along with the change of the touch control signal, accordingly, the signals on the rest signal lines are regulated in synchronization. For example, as shown in FIG. 6, the signal at the second reference signal terminal Ref2 becomes Vss−Vtouch, accordingly, the signals at the reset signal lines are all reduced by Vtouch, so signals on the driving signal line that drives the touch electrodes and respective signal lines are modulated in synchronization, no additional signal difference will be generated between the respective signal lines, thus it is possible to keep the signal differences between the respective signal lines and the signal line that drives the touch electrode constant, which eliminates the parasitic capacitance of the touch electrodes caused by the generation of the touch control signal, and improves touch control performance of the touch panel.

In a subsequent period, the pixel driving circuit will repeat the operation process in steps t1 to t5 as described above.

Figure 7:
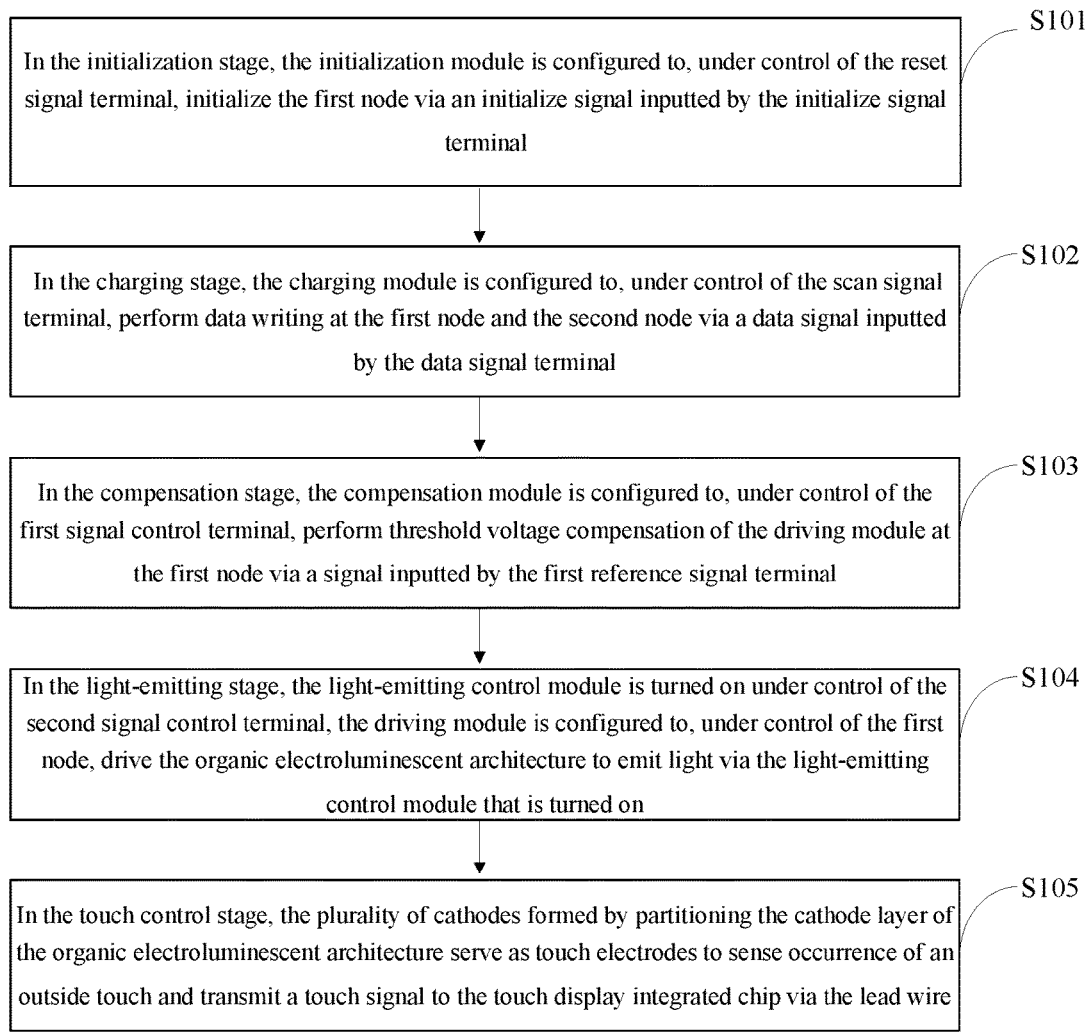
FIG. 7 is a flowchart of the driving method for the organic electroluminescent architecture provided by an embodiment of the present application.

Based on the same inventive concept, an embodiment of the present application provides a driving method for the organic electroluminescent touch panel described above, as shown in FIG. 7, the method may comprise the following steps: an initialization stage, a charging stage, a compensation stage, a light-emitting stage, and a touch control stage that proceed sequentially; wherein S101: in the initialization stage, the initialization module is configured to, under control of the reset signal terminal, initialize the first node via an initialize signal inputted by the initialize signal terminal;

S102: in the charging stage, the charging module is configured to, under control of the scan signal terminal, perform data writing at the first node and the second node via a data signal inputted by the data signal terminal;

S103: in the compensation stage, the compensation module is configured to, under control of the first signal control terminal, perform threshold voltage compensation of the driving module at the first node via a signal inputted by the first reference signal terminal;

S104: in the light-emitting stage, the light-emitting control module is turned on under control of the second signal control terminal, the driving module is configured to, under control of the first node, drive the organic electroluminescent architecture to emit light via the light-emitting control module that is turned on; and S105: in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire.

Specifically, in the driving method for the organic electroluminescent touch panel provided above by an embodiment of the present application, by means of partitioning the cathode layer of the organic electroluminescent architecture, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, and further, determination of touch control points is implemented, that is, implementing that the display panel is integrated with the touch control function based on organic electroluminescent display, and the pixel driving circuit initializes the control terminal of the driving module in the initialization stage, threshold voltage compensation of the driving module is performed in the compensation stage, which avoids an affect caused by change of the threshold voltage of the driving module on lightening luminance, and improves evenness of lightening luminance of the display panel, thus ensures display image quality, meanwhile, in the touch control stage, the plurality of cathodes formed by partitioning the cathode layer of the organic electroluminescent architecture serve as touch electrodes to sense occurrence of an outside touch, signals on the rest signal lines for transmitting various signals, such as a scan signal line, a data line, a power source voltage line, are all modulated in synchronization with external touch control signals sensed by the touch electrodes, the parasitic capacitance of the touch electrode can be eliminated, and touch control performance of the touch panel can be improved.

Based on the same inventive concept, an embodiment of the present application provides a display device comprising the organic electroluminescent touch panel described above. The display device may be applied to mobile phones, tablet computers, televisions, monitors, notebook computers, digital picture frames, navigation systems and any other products or components having a display function. Since the principle by which the display device solves the problem is similar to that of the organic electroluminescent touch panel, thus, as to implementations of this display device, reference may be made to the implementations of the above-described organic electroluminescent touch panel, details are omitted here.

The embodiments of the present application provide an organic electroluminescent touch panel, a driving method for the same, and a display device comprising the same, the organic electroluminescent touch panel comprising: a pixel driving circuit and an organic electroluminescent architecture; wherein a cathode layer of the organic electroluminescent architecture is partitioned into a plurality of cathodes independent of and insulating from each other, the cathodes being connected, via a lead wire, one-by-one, to pins to which a touch display integrated chip corresponds; as such, in a charging stage, the charging module performs data writing at the first node and the second node; in a compensation stage, the compensation module performs threshold voltage compensation of the driving module at the first node; in a light-emitting stage, the driving module drives the organic electroluminescent architecture to emit light via the light-emitting control module that is turned on; in a touch control stage, the plurality of cathodes formed by partitioning the cathode layer of the organic electroluminescent architecture serve as touch electrodes to sense occurrence of an outside touch and transmit a touch signal to the touch display integrated chip via the lead wire. Without changing the original organic electroluminescent architecture, by means of partitioning the cathode layer of the organic electroluminescent architecture, in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, and further, determination of touch control points is implemented, that is, implementing that the display panel is integrated with the touch control function based on organic electroluminescent display, and the pixel driving circuit initializes the control terminal of the driving module in the initialization stage, threshold voltage compensation of the driving module is performed in the compensation stage, which avoids an affect caused by change of the threshold voltage of the driving module on lightening luminance, and improves evenness of lightening luminance of the display panel, thus ensures display image quality, meanwhile, in the touch control stage, the plurality of cathodes formed by partitioning the cathode layer of the organic electroluminescent architecture serve as touch electrodes to sense occurrence of an outside touch, signals on the rest signal lines for transmitting various signals, such as a scan signal line, a data line, a power source voltage line, are all modulated in synchronization with external touch control signals sensed by the touch electrodes, the parasitic capacitance of the touch electrode can be eliminated, and touch control performance of the touch panel can be improved.

Obviously, those skilled in the art can make various modifications and variations to the present disclosure without departing from the spirit and scope thereof. Thus, if these modifications and variations of the present disclosure are within the scope of the claims of the application as well as their equivalents, the present disclosure is also intended to include these modifications and variations.

The present application claims priority of the Chinese Patent Application No. 201510293859.0 filed on Jun. 1, 2015, the entire disclosure of which is hereby incorporated in full text by reference as part of the present application.

What is claimed is:

1. An organic electroluminescent touch panel, comprising: a pixel driving circuit and an organic electroluminescent architecture;
  the organic electroluminescent architecture including: an anode layer, a cathode layer, and a light-emitting layer located between the anode layer and the cathode layer; the cathode layer being partitioned into a plurality of cathodes independent of and insulating from each other, the cathodes being connected, via a lead wire, one-by-one, to pins to which a touch display integrated chip corresponds;

the pixel driving circuit including: an initialization module, a charging module, a compensation module, a driving module, and a light-emitting control module; a control terminal of the initialization module being connected to a reset signal terminal, an input terminal thereof being connected to an initialize signal terminal, and an output terminal thereof being connected to a first node; a first control terminal and a second control terminal of the charging module being both connected to a scan signal terminal, a first input terminal thereof being connected to a data signal terminal, a second input terminal thereof being connected to a third node, a first output terminal thereof being connected to the first node, and a second output terminal thereof being connected to a second node; a control terminal of the compensation module being connected to a first signal control terminal, an input terminal thereof being connected to a first reference signal terminal, and an output terminal thereof being connected to the second node; a control terminal of the driving module being connected with the first node, an input terminal thereof being connected to the first reference signal terminal, and an output terminal thereof being connected to the third node; a control terminal of the light-emitting control module being connected to a second signal control terminal, an input terminal thereof being connected to the third node, and an output terminal thereof being connected to the anode layer of the organic electroluminescent architecture, wherein the pixel driving circuit operates in an initialization stage, a charging stage, a compensation stage, a light-emitting stage, and a touch control stage that proceed sequentially, in the initialization stage, the initialization module is configured to, under control of the reset signal terminal, initialize the first node via an initialize signal inputted by the initialize signal terminal;

in the charging stage, the charging module is configured to, under control of the scan signal terminal, perform data writing at the first node and the second node via a data signal inputted by the data signal terminal;

in the compensation stage, the compensation module is configured to turn on under control of the first signal control terminal, and perform threshold voltage compensation of the driving module at the first node via a signal inputted by the first reference signal terminal;

in the light-emitting stage, the light-emitting control module is turned on under control of the second signal control terminal, the driving module is configured to, under control of the first node, drive the organic electroluminescent architecture to emit light via the light-emitting control module that is turned on;

in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, wherein in the touch control stage, the touch display integrated chip configured to reduce signals on rest signal lines for transmitting various signals and signals on signals lines for driving the touch electrodes by subtracting the touch signal voltage generated by the touch electrodes from the voltage of the rest signal lines for transmitting various signals and from the voltage of the signals on the signal lines for driving the touch electrodes, so that the signals on the rest signal lines for transmitting various signals are modulated in synchronization with the signals on the signals lines for driving the touch electrodes, so that no additional signal voltage difference is generated between the signals on the rest signal lines for transmitting various signals and the signals on the signals lines for driving the touch electrodes.

2. The organic electroluminescent touch panel according to claim 1, wherein the cathode layer of the organic electroluminescent architecture is partitioned to form a plurality of square cathodes, each square cathode has a side length of 4 mm.

3. The organic electroluminescent touch panel according to claim 2, wherein the lead wire is located in a metal layer where a gate line resides, or in a source-drain metal layer, or in a third metal layer other than the metal layer where a gate line resides and the source-drain metal layer.

4. The organic electroluminescent touch panel according to claim 3, wherein the organic electroluminescent architecture further comprises a hole transmission layer and an electron transmission layer;
the hole transmission layer is located between the anode layer and the light-emitting layer;
the electron transmission layer is located between the cathode layer and the light-emitting layer.

5. The organic electroluminescent touch panel according to claim 4, wherein material of the cathode layer is a magnesium aluminum alloy or a magnesium silver alloy, material of the anode material layer is ITO material.

6. The organic electroluminescent touch panel according to claim 1, wherein the driving module includes a driving transistor;
a gate of the driving transistor is connected to the first node, a source thereof is connected to the first reference signal terminal, and a drain thereof is connected to the third node.

7. The organic electroluminescent touch panel according to claim 1, wherein the initialization module includes a first switching transistor;
a gate of the first switching transistor is connected to the reset signal terminal, a source thereof is connected to the initialize signal terminal, and a drain thereof is connected to the first node.

8. The organic electroluminescent touch panel according to claim 1, wherein the charging module includes a second switching transistor, a third switching transistor, and a capacitor;
a gate of the second switching transistor is connected to the scan signal terminal, a source thereof is connected to the third node, and a drain thereof is connected to the first node;
a gate of the third switching transistor is connected to the scan signal terminal, a source thereof is connected to the data signal terminal, and a drain thereof is connected to the second node; and
the capacitor is connected between the first node and the second node.

9. The organic electroluminescent touch panel according to claim 1, wherein the compensation module includes a fourth switching transistor;
a gate of the fourth switching transistor is connected to the first signal control terminal, a source thereof is connected to the first reference signal terminal, a drain thereof is connected to the second node.

10. The organic electroluminescent touch panel according to claim 1, wherein the light-emitting control module includes a fifth switching transistor;

a gate of the fifth switching transistor is connected to the second signal control terminal, a source thereof is connected to the third node, and a drain thereof is connected to the anode layer of the organic electroluminescent architecture.

11. A driving method for the organic electroluminescent touch panel according to claim 1, comprising: an initialization stage, a charging stage, a compensation stage, a light-emitting stage, and a touch control stage that proceed sequentially; wherein in the initialization stage, the initialization module is configured to, under control of the reset signal terminal, initialize the first node via a initialize signal inputted by the initialize signal terminal;

in the charging stage, the charging module is configured to, under control of the scan signal terminal, perform data writing at the first node and the second node via a data signal inputted by the data signal terminal;

in the compensation stage, the compensation module is configured to turn on under control of the first signal control terminal, and perform threshold voltage compensation of the driving module at the first node via a signal inputted by the first reference signal terminal;

in the light-emitting stage, the light-emitting control module is turned on under control of the second signal control terminal, the driving module is configured to, under control of the first node, drive the organic electroluminescent architecture to emit light via the light-emitting control module that is turned on; and in the touch control stage, the plurality of cathodes formed by partitioning the cathode layer of the organic electroluminescent architecture serve as touch electrodes to sense occurrence of an outside touch and transmit a touch signal to the touch display integrated chip via the lead wire, wherein in the touch control stage, the touch display integrated chip configured to reduce signals on rest signal lines for transmitting various signals and signals on signals lines for driving the touch electrodes by subtracting the touch signal voltage generated by the touch electrodes from the voltage of the rest signal lines for transmitting various signals and from the voltage of the signals on the signal lines for driving the touch electrodes, so that the signals on the rest signal lines for transmitting various signals are modulated in synchronization with the signals on the signals lines for driving the touch electrodes, so that no additional signal voltage difference is generated between the signals on the rest signal lines for transmitting various signals and the signals on the signals lines for driving the touch electrodes.

12. A display device comprising the organic electroluminescent touch panel according to claim 1.

13. The display device according to claim 12, wherein the cathode layer of the organic electroluminescent architecture are partitioned to form a plurality of square cathodes, each square cathode has a side length of 4 mm.

14. The display device according to claim 13, wherein the lead wire is located in a metal layer where a gate line resides, or in a source-drain metal layer, or in a third metal layer other than the metal layer where a gate line resides and the source-drain metal layer.

15. The display device according to claim 14, wherein the organic electroluminescent architecture further comprises a hole transmission layer and an electron transmission layer;

the hole transmission layer is located between the anode layer and the light-emitting layer;

the electron transmission layer is located between the cathode layer and the light-emitting layer.

16. The display device according to claim 12, wherein the driving module includes a driving transistor;

a gate of the driving transistor is connected to the first node, a source thereof is connected to the first reference signal terminal, and a drain thereof is connected to the third node.

17. The display device according to claim 12, wherein the initialization module includes a first switching transistor;

a gate of the first switching transistor is connected to the reset signal terminal, a source thereof is connected to the initialize signal terminal, and a drain thereof is connected to the first node.

18. The display device according to claim 12, wherein the charging module includes a second switching transistor, a third switching transistor, and a capacitor;

a gate of the second switching transistor is connected to the scan signal terminal, a source thereof is connected to the third node, and a drain thereof is connected to the first node;

a gate of the third switching transistor is connected to the scan signal terminal, a source thereof is connected to the data signal terminal, and a drain thereof is connected to the second node; and he capacitor is connected between the first node and the second node.

19. The display device according to claim 12, wherein the compensation module includes a fourth switching transistor;

a gate of the fourth switching transistor is connected to the first signal control terminal, a source thereof is connected to the first reference signal terminal, a drain thereof is connected to the second node.

20. The display device according to claim 12, wherein the light-emitting control module includes a fifth switching transistor;

a gate of the fifth switching transistor is connected to the second signal control terminal, a source thereof is connected to the third node, and a drain thereof is connected to the anode layer of the organic electroluminescent architecture.

* * * * *